(12) United States Patent
Morandini et al.

(10) Patent No.: US 12,476,134 B2
(45) Date of Patent: Nov. 18, 2025

(54) SEMICONDUCTOR STRUCTURE FOR DIGITAL AND RADIOFREQUENCY APPLICATIONS, AND METHOD FOR MANUFACTURING SUCH A STRUCTURE

(71) Applicant: Soitec, Bernin (FR)

(72) Inventors: Yvan Morandini, La Trinite (FR); Walter Schwarzenbach, Saint Nazaire les Eymes (FR); Frédéric Allibert, Grenoble (FR); Eric Desbonnets, Lumbin (FR); Bich-Yen Nguyen, Austin, TX (US)

(73) Assignee: Soitec, Bernin (FR)

( * ) Notice: Subject to any disclaimer, the term of this patent is extended or adjusted under 35 U.S.C. 154(b) by 842 days.

(21) Appl. No.: 17/418,117

(22) PCT Filed: Dec. 23, 2019

(86) PCT No.: PCT/FR2019/053279
§ 371 (c)(1),
(2) Date: Jun. 24, 2021

(87) PCT Pub. No.: WO2020/136642
PCT Pub. Date: Jul. 2, 2020

(65) Prior Publication Data
US 2022/0076993 A1 Mar. 10, 2022

(30) Foreign Application Priority Data
Dec. 24, 2018 (FR) .................................. 1874130

(51) Int. Cl.
*H01L 21/762* (2006.01)
*H01L 21/02* (2006.01)
(Continued)

(52) U.S. Cl.
CPC .... *H01L 21/76254* (2013.01); *H01L 21/0262* (2013.01); *H01L 21/3226* (2013.01);
(Continued)

(58) Field of Classification Search
CPC .......... H01L 21/76254; H01L 21/0262; H01L 21/3226; H01L 21/76281; H01L 27/1207;
(Continued)

(56) References Cited

U.S. PATENT DOCUMENTS 9,824,891 B1 * 11/2017 Sun .................. H01L 21/30625
2002/0094629 A1 7/2002 Belleville et al.
(Continued)

FOREIGN PATENT DOCUMENTS

| CN | 1866529 A | 11/2006 |
| CN | 102272926 A | 12/2011 |

(Continued)

OTHER PUBLICATIONS

Taiwan Office Action and Search Report for Application No. 108147239 dated Jan. 19, 2023, 9 pages.
(Continued)

*Primary Examiner* — Antonio B Crite
*Assistant Examiner* — Adin Hrnjic
(74) *Attorney, Agent, or Firm* — TraskBritt

(57) ABSTRACT

The present disclosure relates to a multilayer semiconductor-on-insulator structure, comprising, successively from a rear face toward a front face of the structure: a semiconductor carrier substrate with high electrical resistivity, whose electrical resistivity is between 500 Ω·cm and 30 kΩ·cm, a first electrically insulating layer, an intermediate layer, a second electrically insulating layer, which has a thickness less than that of the first electrically insulating layer, an active semiconductor layer, the multilayer structure comprises: at least one FD-SOI region, in which the inter-
(Continued)

mediate layer is an intermediate first semiconductor layer, at least one RF-SOI region, adjacent to the FD-SOI region, in which the intermediate layer is a third electrically insulating layer, the RF-SOI region comprising at least one radiofrequency component plumb with the third electrically insulating layer.

20 Claims, 4 Drawing Sheets

(51) Int. Cl.
H01L 21/322 (2006.01)
H10D 62/10 (2025.01)
H10D 87/00 (2025.01)

(52) U.S. Cl.
CPC ..... *H01L 21/76281* (2013.01); *H10D 62/115* (2025.01); *H10D 87/00* (2025.01)

(58) Field of Classification Search
CPC ........... H01L 29/0649; H01L 21/02002; H01L 21/76264; H01L 21/84; H01L 27/1203
See application file for complete search history.

(56) References Cited

U.S. PATENT DOCUMENTS

| | | |
|---|---|---|
| 2003/0042532 A1 | 3/2003 | Forbes |
| 2005/0085004 A1 | 4/2005 | Lai et al. |
| 2005/0242398 A1 | 11/2005 | Chen et al. |
| 2006/0017137 A1 | 1/2006 | Iwamatsu |
| 2006/0087000 A1* | 4/2006 | Okuno ............... H01L 21/76232 257/E21.549 |
| 2006/0261410 A1* | 11/2006 | Ohguro ................ H01L 21/84 438/153 |
| 2007/0099372 A1 | 5/2007 | Chittipeddi et al. |
| 2008/0242051 A1 | 10/2008 | Yamazaki et al. |
| 2009/0267178 A1 | 10/2009 | Abadeer et al. |
| 2010/0176453 A1 | 7/2010 | Dennard et al. |
| 2010/0176482 A1 | 7/2010 | Dennard et al. |
| 2011/0244660 A1* | 10/2011 | Koezuka ........... H01L 21/26506 257/E21.317 |
| 2011/0269266 A1 | 11/2011 | Yamazaki |
| 2014/0191322 A1* | 7/2014 | Botula ................ H01L 21/84 438/151 |
| 2016/0372484 A1 | 12/2016 | Nguyen et al. |
| 2018/0233400 A1* | 8/2018 | Wang ................. H01L 21/0245 |
| 2018/0247860 A1 | 8/2018 | Ishizuka et al. |
| 2018/0337043 A1 | 11/2018 | Englekirk et al. |

FOREIGN PATENT DOCUMENTS

| | | |
|---|---|---|
| CN | 103339732 A | 10/2013 |
| CN | 106257641 A | 12/2016 |
| DE | 102020101433 A1 | 8/2020 |
| JP | 2006-040911 A | 2/2006 |
| JP | 2006-324415 A | 11/2006 |
| JP | 2014-204009 A | 10/2014 |
| JP | 2016-164951 A | 9/2016 |
| JP | 2017-011262 A | 1/2017 |
| JP | 2017-069240 A | 4/2017 |
| TW | 201705382 A | 2/2017 |
| WO | 2018/142052 A1 | 8/2018 |

OTHER PUBLICATIONS

Chinese Office Action and Search Report for Application No. 201980092652.3 dated Dec. 22, 2023, 18 pages with English translation.
International Search Report for International Application No. PCT/FR2019/053279 dated Apr. 24, 2020, 2 pages.
International Written Opinion for International Application No. PCT/FR2019/053279 dated Apr. 24, 2020, 6 pages.
Taiwanese Office Action for Application No. 11220800960 dated Aug. 16, 2023, 14 pages with machine translation.
Taiwanese Office Action for Application No. 108147239 dated Oct. 7, 2024, 10 pages with machine translation.
European Communication for party to proceedings/third party dated Jan. 2, 2023, 5 pages with machine 1 translation.
Decision to Grant for Japanese Application No. 2021-535053, dated Mar. 7, 2023, 5 pages with English translation.
Korean Office Action for Application No. 10-2021-7023060 dated Jun. 19, 2024, 20 pages with machine translation.
Taiwanese Office Action for Application No. 108147239 dated May 24, 2024, 6 pages with machine translation.

* cited by examiner

SEMICONDUCTOR STRUCTURE FOR DIGITAL AND RADIOFREQUENCY APPLICATIONS, AND METHOD FOR MANUFACTURING SUCH A STRUCTURE

CROSS-REFERENCE TO RELATED APPLICATIONS

This application is a national phase entry under 35 U.S.C. § 371 of International Patent Application PCT/FR2019/053279, filed Dec. 23, 2019, designating the United States of America and published as International Patent Publication WO 2020/136342 A1 on Jul. 2, 2020, which claims the benefit under Article 8 of the Patent Cooperation Treaty to French Patent Application Serial No. 1874130, filed Dec. 24, 2018.

TECHNICAL FIELD

The present disclosure relates to a semiconductor-on-insulator structure for digital and radiofrequency applications. The present disclosure also relates to a process for fabricating such a structure via transfer of a layer from a first substrate, called the "donor substrate," to a second substrate, called the "receiver substrate."

BACKGROUND

Semiconductor-on-insulator structures are multilayer structures comprising a substrate, which is generally made of silicon, an electrically insulating layer arranged on top of the substrate, which is generally a layer of oxide such as a layer of silicon oxide, and, arranged on top of the insulating layer, a semiconductor layer in which the source and drain of the structure are produced, and which is generally a layer of silicon.

Such structures are referred to as semiconductor-on-insulator (SeOI) structures, and, in particular, are referred to as "silicon-on-insulator" (SOI) structures when the semiconductor is silicon.

Among existing SOI structures, fully-depleted silicon-on-insulator (FD-SOI) structures are commonly used for digital applications. FD-SOI structures are characterized by the presence of a thin oxide layer, arranged on a silicon carrier substrate, and of a very thin semiconductor layer called the SOI layer arranged on the oxide layer.

The oxide layer is located between the substrate and the SOI layer. The oxide layer is then said to be "buried" and is called the "BOX" for Buried OXide.

The SOI layer allows the conduction channel to be formed in the FD-SOI structure.

Because of the small thickness and of the uniformity of the BOX layer and of the SOI layer, it is not necessary to dope the conduction channel, and hence the structure is able to operate in a fully depleted mode.

FD-SOI structures have improved electrostatic characteristics with respect to structures without BOX layers. The BOX layer decreases the parasitic electrical capacitance between the source and drain, and also allows leakage of electrons from the conduction channel to the substrate to be considerably decreased by confining the flow of electrons to the conduction channel, thus decreasing electric current losses and improving the performance of the structure.

FD-SOI structures can be compatible with radio-frequency (RF) applications, but however suffer from the appearance of electrical losses in the substrate.

To compensate for these electrical losses and improve RF performance, it is known to use a substrate, in particular, an SOI substrate, having a high electrical resistivity, this type of substrate commonly being referred to as an "HR substrate" for high-resistivity substrate. The latter is advantageously combined with a charge-trapping layer, i.e., a trap-rich layer. However, this type of substrate is incompatible with use of transistors the threshold voltage of which may be controlled via a back-side gate (back bias voltage).

Specifically, the presence of this layer containing trapped charges hinders back biasing (application of a potential difference to the back side) and may furthermore lead to an accelerated diffusion of dopants, thus preventing the production of high-quality PN junctions, because of problems with junction leakage.

In addition to FD-SOI structures comprising one BOX layer, FD-SOI structures comprising two BOX layers, which are called "double BOX" structures, have been produced.

The double-BOX-layer technology is advantageous in the case where the FD-SOI structure comprises double-gate transistors the gate electrodes of which are formed both above and below the conduction channel. Thus, the SOI layer of the back gate, which is called the back-gate SOI layer, is electrically separated from the SOI layer of the front gate, which is called the front-gate SOI layer, by a first BOX layer, and is also electrically separated from the base substrate by a second BOX layer.

Document US 2010/0176482 describes an example of such an FD-SOI structure comprising two BOX layers, for a CMOS technology.

According to this document, CMOS structures with a high-k gate dielectric and with a gate length of as small as 30 nm are fabricated using an optimized process allowing a good isolation between the devices and the back gate to be obtained.

The existing double-BOX technology is used for digital applications, and not both for radiofrequency and digital applications.

Moreover, the maximum power rating of double-BOX FD-SOI structures is limited with BOX layers of standard thickness. This is a problem for radiofrequency applications.

Specifically, to increase the power rating of certain radiofrequency components, such as power amplifiers and antenna switches, it is necessary to stack MOSFETs (MOSFET being the acronym of Metal-Oxide-Semiconductor Field-Effect Transistor) in order to ensure that the voltage between the drain and source is lower than the maximum permitted operating voltage.

However, the maximum voltage between the drain and the carrier substrate and the maximum voltage between the source and the carrier substrate are limited by the breakdown voltage of the BOX layer. With a BOX layer of standard thickness of 20 nm, the breakdown voltage is only 25 V (this leading to the design of devices with a much lower maximum voltage, ranging from 10 to 15 V), this being a substantial limitation.

Thus, the existing double-BOX technology for digital applications is incompatible with radiofrequency applications.

BRIEF SUMMARY

One aim of the present disclosure is to provide a semiconductor-on-insulator structure allowing the aforementioned drawbacks to be overcome. The present disclosure aims to provide such a structure allowing digital applications and radiofrequency applications to be combined.

To this end, the present disclosure provides a semiconductor-on-insulator structure, comprising in succession from a back side to a front side of the structure:
- a semiconductor carrier substrate having a high electrical resistivity, the electrical resistivity being between 500 Ω·cm and 30 kΩ·cm,
- a first electrically insulating layer,
- an intermediate layer,
- a second electrically insulating layer, which has a thickness smaller than that of the first electrically insulating layer, and
- an active semiconductor layer, the multilayer structure being characterized in that it comprises:
- at least one FD-SOI region, in which the intermediate layer is a semiconductor layer, and
- at least one RF-SOI region, adjacent to the FD-SOI region, in which the intermediate layer is a third electrically insulating layer, the RF-SOI region comprising at least one radiofrequency component plumb with the third electrically insulating layer.

According to other aspects, the proposed structure has the following various features, which may be implemented alone or in technically feasible combinations thereof:
- the sum of the thicknesses of the first electrically insulating layer, of the second electrically insulating layer, and of the third electrically insulating layer is between 50 nm and 1500 nm;
- the structure furthermore comprises a charge-trapping layer arranged between the carrier substrate and the first electrically insulating layer;
- the charge-trapping layer is made of polysilicon or of porous silicon;
- the intermediate semiconductor layer is made of crystalline or polycrystalline material;
- the intermediate semiconductor layer is made of amorphous material;
- the first electrically insulating layer is a layer of silicon oxide;
- the second electrically insulating layer is a layer of silicon oxide;
- the third electrically insulating layer is a layer of silicon oxide;
- the first electrically insulating layer has a thickness between 20 nm and 1000 nm;
- the second electrically insulating layer has a thickness between 10 nm and 100 nm; and
- the active semiconductor layer has a thickness between 3 nm and 30 nm.

The present disclosure also relates to a process for fabricating a semiconductor-on-insulator multilayer structure, comprising the following steps:
- providing a first donor substrate,
- forming a weakened zone in the first donor substrate, so as to delineate an intermediate first semiconductor layer,
- transferring the intermediate first semiconductor layer to a semiconductor carrier substrate, a first electrically insulating layer being at the interface between the donor substrate and the carrier substrate so as to form an intermediate structure comprising the carrier substrate, the first electrically insulating layer and the transferred intermediate first semiconductor layer,
- locally removing one segment of the intermediate first semiconductor layer down to the first electrically insulating layer in order to form a cavity,
- depositing an electrically insulating layer, called the third electrically insulating layer, in the cavity,
- providing a second donor substrate,
- forming a weakened zone in the second donor substrate, so as to delineate an active second semiconductor layer,
- transferring the active second semiconductor layer to the intermediate structure, a second electrically insulating layer being at the interface between the second donor substrate and the intermediate structure, and
- producing:
  - at least one digital component in the active second semiconductor layer plumb with the intermediate first semiconductor layer, in order to form an FD-SOI region, and
  - at least one radiofrequency component plumb with the third electrically insulating layer, in order to form an RF-SOI region.

The present disclosure also relates to a process for fabricating a semiconductor-on-insulator multilayer structure, comprising the following steps:
- forming an intermediate structure by depositing an intermediate first semiconductor layer on a carrier substrate covered with a first electrically insulating layer,
- locally removing one segment of the intermediate first semiconductor layer down to the first electrically insulating layer in order to form a cavity,
- depositing an electrically insulating layer, called the third electrically insulating layer, in the cavity,
- providing a donor substrate,
- forming a weakened zone in the donor substrate to delineate an active second semiconductor layer,
- transferring the active second semiconductor layer to the intermediate structure, a second electrically insulating layer being at the interface between the donor substrate and the intermediate structure, and
- producing:
  - at least one digital component in the active second semiconductor layer plumb with the intermediate first semiconductor layer, in order to form an FD-SOI region, and
  - at least one radiofrequency component plumb with the third electrically insulating layer, in order to form an RF-SOI region.

According to other aspects, the proposed processes have the following various features, which may be implemented alone or in technically feasible combinations thereof:
- the radiofrequency component is produced in the active second semiconductor layer;
- the local removal of a segment of the intermediate first semiconductor layer and the deposition of a third electrically insulating layer in the cavity are carried out after the transfer of the second semiconductor layer to the intermediate structure;
- the process furthermore comprises forming a charge-trapping layer on the carrier substrate, the charge-trapping layer being arranged between the carrier substrate and the first electrically insulating layer;
- the local removal comprises depositing a mask by lithography and etching the intermediate first semiconductor layer through at least one aperture of the mask; and
- the process furthermore comprises, before the transfer of the second semiconductor layer to the intermediate structure, treating the free surfaces of the intermediate first semiconductor layer and the third electrically insulating layer in order to decrease the roughness thereof.

The multilayer structure of the present disclosure serves as carrier for the fabrication of transistors, in particular, MOSFETs. MOSFETs are semiconductor devices comprising three active electrodes, namely an input electrode called the gate, an output electrode called the drain, and a third electrode called the source. These transistors allow a voltage (or a current) output on the drain to be controlled by virtue of the gate.

In the present text, the term "on," when it relates to the position of a first layer with respect to a second layer, or the position of a component with respect to a layer, does not necessarily imply that the first layer makes direct contact with the second or that the component makes direct contact with the layer. Unless otherwise specified, this term does not exclude one or more other layers being intermediate between the first layer and the second layer, or between the component and the layer.

The expression "plumb with," which relates to the position of a component with respect to a layer within a structure, means that the component and the layer face each other in the direction of the thickness of the structure. In other words, any axis that extends through the thickness of the structure and that intercepts the component, also intercepts the layer plumb with this component.

BRIEF DESCRIPTION OF THE DRAWINGS

Other advantages and features of the present disclosure will become apparent upon reading the following description given by way of illustrative and non-limiting example, with reference to the following accompanying figures.

DETAILED DESCRIPTION

A first subject of the present disclosure relates to a semiconductor-on-insulator multilayer structure that is usable both for digital applications and for radiofrequency applications.

Figure 1:
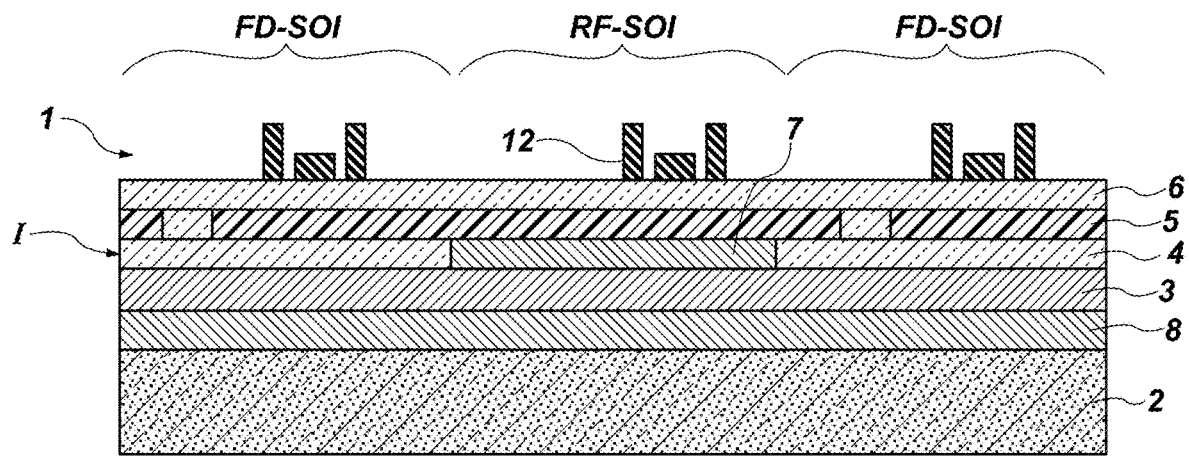
FIG. 1 is a schematic of one embodiment of a multilayer structure according to present disclosure, comprising two FD-SOI regions and one RF-SOI region.

FIG. 1 illustrates one embodiment of such a multilayer structure 1 according to the present disclosure.

With reference to FIG. 1, the multilayer structure 1 comprises in succession, from a back side to a front side of the structure, a semiconductor carrier substrate 2, a first electrically insulating layer 3, an intermediate layer I, a second electrically insulating layer 5, and an active semiconductor layer 6.

The semiconductor carrier substrate 2 is a highly resistive substrate, i.e., it has an electrical resistivity between 500 $\Omega$·cm and 30 k$\Omega$·cm, and preferably between 1 k$\Omega$·cm and 10 k$\Omega$·cm. A high resistivity gives the carrier substrate the ability to limit electrical losses and to improve the radiofrequency performance of the structure.

The first electrically insulating layer 3 allows the carrier substrate 2 to be insulated from the intermediate layer I and from the layers superjacent the intermediate layer.

The first electrically insulating layer 3 is preferably a layer of oxide. Since this layer is buried in the structure between the carrier substrate and the intermediate layer, it may also be called the "first BOX." It is preferably a layer of silicon oxide.

The thickness of the first electrically insulating layer 3 is relatively large, and preferably between 20 nm (nanometers) and 1000 nm. Specifically, too small a thickness, in particular, one smaller than 20 nm, would run the risk of breakdown of the first electrically insulating layer. In particular, the first electrically insulating layer 3 preferably has a thickness larger than that of the active semiconductor layer 6.

Optionally, the multilayer structure 1 also comprises a charge-trapping layer 8, which is preferably made of polysilicon or of porous silicon, arranged between the carrier substrate 2 and the first electrically insulating layer 3. This charge-trapping layer allows the electrical charge that accumulates under the first electrically insulating layer 3 to be trapped.

The second electrically insulating layer 5 allows the active semiconductor layer 6 to be insulated from the intermediate layer I and from the layers subjacent the intermediate layer.

The second electrically insulating layer 5 is preferably a layer of oxide, and preferably a layer of silicon oxide. Since this layer is buried in the structure between the intermediate layer and the active semiconductor layer, it may be called the "second BOX."

The second electrically insulating layer 5 has a thickness that is relatively small, and smaller than that of the first electrically insulating layer 3. This small thickness makes it possible to be able to control the threshold voltage of the transistor via suitable biasing (back bias voltage) of the subjacent intermediate layer. A thickness of the second electrically insulating layer 5 is preferably between 10 nm and 100 nm for this reason.

The active semiconductor layer 6 is intended for the production both of digital components 11 and optionally of radiofrequency components 12, the components produced depending on the digital and radiofrequency applications desired for the structure.

The active semiconductor layer 6 is preferably a layer of single-crystal silicon.

The thickness of the active semiconductor layer 6 is preferably between 3 nm and 30 nm, and more preferably between 5 nm and 20 nm. It is preferable for the thickness of the active semiconductor layer to be uniform over all the extent of the material, i.e., for its thickness to vary by 1 nm or less, in order to optimize the operation of the FD-SOI regions, in a fully depleted mode. The FD-SOI regions are described in detail below in the present text.

The multilayer structure 1 comprises a plurality of regions intended for different applications, including at least one FD-SOI region for digital applications and at least one RF-SOI region for radiofrequency applications.

In order to be able to combine an FD-SOI region and an RF-SOI region in one and the same structure, the intermediate layer I is arranged between the first and second electrically insulating layers 3, 5, and the nature of this intermediate layer I is different depending on whether it is in an FD-SOI region or in an RF-SOI region.

Figure 2:
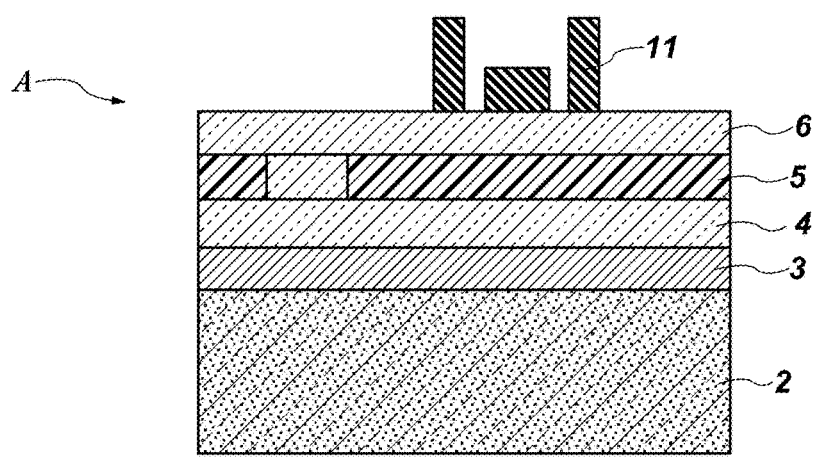
FIG. 2 is a schematic of one of the FD-SOI regions of the structure illustrated in FIG. 1.

One of the two FD-SOI regions of the structure of FIG. 1 is shown in FIG. 2.

In an FD-SOI region, the intermediate layer I is an intermediate first semiconductor layer 4.

The intermediate first semiconductor layer 4 is advantageously made of a crystalline material or of an amorphous material, which may optionally be doped. This material is chosen so that the semiconductor layer may be biased in order to control the threshold voltage of the transistor.

The material of the intermediate first semiconductor layer 4 is advantageously a semiconductor preferably chosen from: single-crystal silicon, polysilicon, and an alloy of Si and Ge.

The FD-SOI region comprises at least one digital component 11 in the active semiconductor layer 6. In FIG. 1, the digital component is thus positioned plumb with the semiconductor layer.

Figure 3:
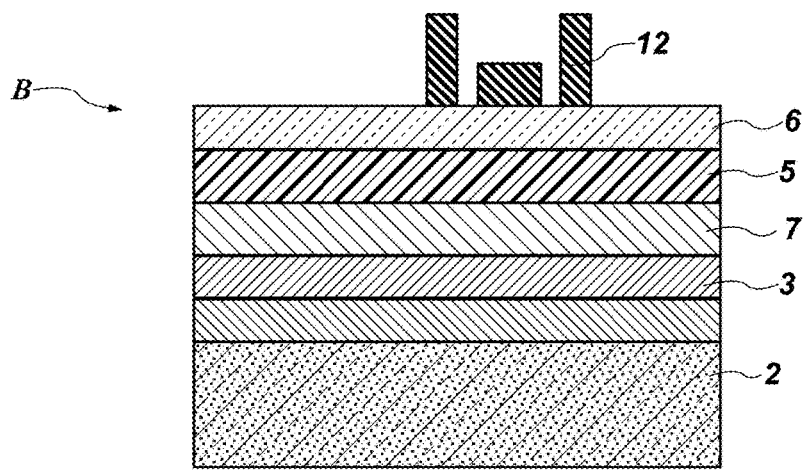
FIG. 3 is a schematic of the RF-SOI region of the structure illustrated in FIG. 1.

The RF-SOI region of the structure of FIG. 1 is shown in FIG. 3.

In an RF-SOI region, the intermediate layer I is an electrically insulating layer 7, called the third electrically insulating layer.

The third electrically insulating layer 7 allows the active semiconductor layer 6 to be better isolated from the carrier substrate 2, i.e., the front gate to be electrically isolated from the back gate of the transistor.

The third electrically insulating layer 7 is preferably a layer of oxide. Since this layer is buried in the structure between the first and second electrically insulating layers, it may be called the "third BOX." It is preferably a layer of silicon oxide.

The RF-SOI region comprises at least one radiofrequency component 12 plumb with the third electrically insulating layer 7, in particular, in the active semiconductor layer 6. The radiofrequency component 12 may also be formed in one of the electrically insulating layers 5, 7 or 3, and preferably on the second electrically insulating layer 5, in order to benefit from the effect of a BOX composed of three electrically insulating layers 5, 7 and 3. In FIG. 3, the radiofrequency component is thus positioned plumb with the third electrically insulating layer.

According to one preferred embodiment, the sum of the thicknesses of the first electrically insulating layer 3, of the second electrically insulating layer 5, and of the third electrically insulating layer 7 is between 50 nm and 1500 nm. The thickness of each of the three electrically insulating layers is therefore adjusted to obtain the described total thickness. Such a thickness allows the breakdown voltage to be optimized for the radiofrequency components.

Three embodiments of a process for fabricating a multilayer structure 1 such as described above will now be described.

According to a first embodiment, a first donor substrate is initially provided.

A weakened zone is formed in the substrate to delineate an intermediate first semiconductor layer. The weakened zone is formed in the donor substrate at a predefined depth that corresponds substantially to the thickness of the semiconductor layer to be transferred. Preferably, the weakened zone is created by implanting hydrogen and/or helium atoms into the donor substrate.

The intermediate first semiconductor layer is then transferred to a semiconductor carrier substrate, which is a receiver substrate, by bonding the donor substrate to the carrier substrate via the first electrically insulating layer then by detaching the donor substrate along the weakened zone (SMART CUT™ process).

Alternatively, the transfer may be achieved by thinning the donor substrate from the side thereof opposite the side bonded to the carrier substrate, until the thickness desired for the intermediate first semiconductor layer is obtained.

Optionally, before the bonding step, a charge-trapping layer is formed on the carrier substrate, between the carrier substrate and the first electrically insulating layer.

Figure 4:
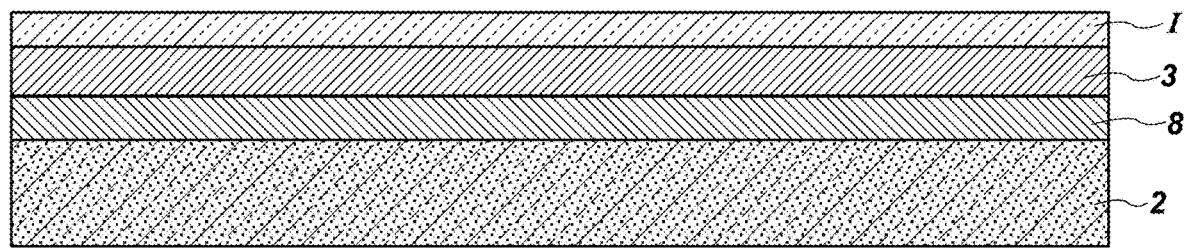
FIG. 4 is a schematic of an intermediate structure, comprising an intermediate first semiconductor layer on a carrier substrate that has been covered beforehand with a first electrically insulating layer.

As illustrated in FIG. 4, an intermediate structure comprising the carrier substrate 2, the charge-trapping layer 8 when present, the first electrically insulating layer 3 and the transferred intermediate first semiconductor layer I is then obtained.

Figure 5:
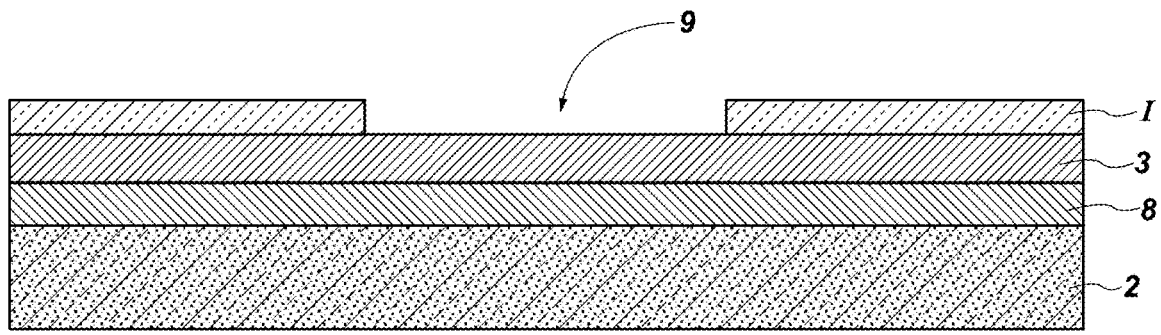
FIG. 5 is a schematic of the intermediate structure of FIG. 4, in which a cavity has been produced.

With reference to FIG. 5, one segment of the intermediate first semiconductor layer is then removed down to the first electrically insulating layer in order to form a cavity 9. In FIG. 5, the cavity 9 is bounded in the thickness of the structure by the first electrically insulating layer 3, and laterally by two segments of the intermediate first semiconductor layer 4.

The local removal may advantageously be carried out by etching. To this end, a lithography mask is deposited on the intermediate first semiconductor layer 4. The mask is provided with at least one aperture. The intermediate first semiconductor layer is then etched through the aperture of the mask in order to form the cavity 9. Any known etching technique suitable for this purpose may be used, such as, for example, dry etching.

Figure 6:
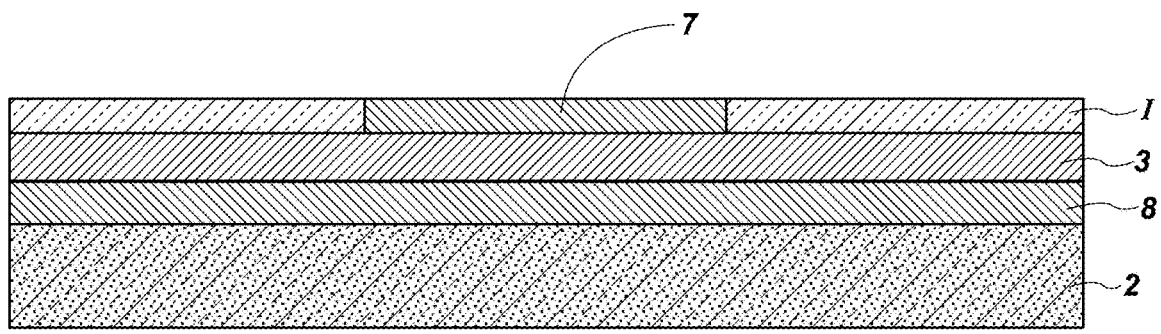
FIG. 6 is a schematic of the intermediate structure of FIG. 5, in which a cavity has been filled with an electrically insulating layer.

With reference to FIG. 6, the third electrically insulating layer 7 is then deposited in the cavity 9, in order to fill the cavity. After this deposition, the upper surface of the third electrically insulating layer lies flush with the upper surface of the semiconductor layer.

Moreover, a second donor substrate is provided.

A weakened zone is formed in the substrate to delineate a second semiconductor layer 6. The weakened zone may be formed in the same way used to delineate the intermediate first semiconductor layer.

The second semiconductor layer 6 is then transferred to the intermediate structure, by bonding the second donor substrate to the intermediate structure via the second electrically insulating layer 5 (formed either on the intermediate structure or on the donor substrate) then by detaching the donor substrate along the weakened zone (SMART CUT™ process).

Alternatively, the transfer may be achieved by thinning the second donor substrate from the side thereof opposite the side bonded to the intermediate structure, until the thickness desired for the second semiconductor layer 6 is obtained.

Optionally, before the transferring step, it is possible to carry out a treatment of the free surfaces of the intermediate first semiconductor layer and of the third electrically insulating layer, in order to decrease the roughness thereof. This surface treatment improves the bonding of the second electrically insulating layer to the intermediate first semiconductor layer and third electrically insulating layer.

Next, one or more digital components 11 are produced on the second semiconductor layer 6, which is the active semiconductor layer. The digital components are produced plumb with the intermediate first semiconductor layer, i.e., facing the intermediate first semiconductor layer in the direction of the thickness of the structure. This allows an FD-SOI region to be obtained.

One or more radiofrequency components 12 are also produced on the active semiconductor layer, plumb with the third electrically insulating layer 7. This allows an RF-SOI region to be obtained.

The first embodiment that has just been described comprises two steps of delineating and transferring a semiconductor layer. This is most particularly advantageous in the case where the intermediate first semiconductor layer is crystalline. The transfer of such a layer from a donor substrate allows its crystal quality to be preserved on the final structure.

When an optimization of the crystal quality of the intermediate first semiconductor layer is not required, for example, when the latter is amorphous, it is possible to form the intermediate first semiconductor layer by deposition on the first electrically insulating layer. This process then employs only a single transferring step, i.e., the step of transferring the active semiconductor layer, and is therefore more economical.

This method corresponds to a second embodiment that will now be described.

According to a second embodiment, an intermediate structure, as illustrated in FIG. 4, is formed by depositing an intermediate first semiconductor layer 4 on a carrier substrate 2 covered beforehand with a first electrically insulating layer 3.

The intermediate first semiconductor layer 4 may be formed by epitaxy on the carrier substrate covered with a first electrically insulating layer, or, alternatively, deposited on the carrier substrate, in particular, by chemical vapor deposition (CVD).

Optionally, before the deposition of the intermediate first semiconductor layer, a charge-trapping layer 8 is formed on the carrier substrate 2, between the carrier substrate and the first electrically insulating layer 3.

With reference to FIG. 5, one segment of the intermediate first semiconductor layer 4 is then removed down to the first electrically insulating layer 3 in order to form a cavity 9. In FIG. 5, the cavity 9 is bounded in the thickness of the structure by the first electrically insulating layer 3, and laterally by two segments of the intermediate first semiconductor layer 4.

The local removal may advantageously be carried out by etching, similarly to the first embodiment.

With reference to FIG. 6, an electrically insulating layer 7, called the third electrically insulating layer, is then deposited in the cavity 9 in order to fill the cavity. After this deposition, the upper surface of the third electrically insulating layer 7 lies flush with the upper surface of the intermediate first semiconductor layer 4.

Moreover, a donor substrate is provided.

A weakened zone is formed in the substrate to delineate a second semiconductor layer 6. The weakened zone may be formed in the same way used for the first embodiment.

The second semiconductor layer 6 is then transferred to the intermediate structure, by bonding the donor substrate to the intermediate structure via the second electrically insulating layer 5 then by detaching the donor substrate along the weakened zone (SMART CUT™ process).

Alternatively, the transfer may be achieved by thinning the donor substrate from the side thereof opposite the side bonded to the intermediate structure, until the thickness desired for the second semiconductor layer 6 is obtained.

Optionally, before the transferring step, it is possible to carry out a treatment of the free surfaces of the intermediate first semiconductor layer 4 and of the third electrically insulating layer 7, in order to decrease the roughness thereof. This surface treatment improves the bonding of the second electrically insulating layer to the intermediate first semiconductor layer and third electrically insulating layer.

Next, one or more digital components 11 are produced on the second semiconductor layer 6, which is the active semiconductor layer. The digital components 11 are produced plumb with the intermediate first semiconductor layer 4. This allows an FD-SOI region to be obtained.

One or more radiofrequency components 12 are also produced on the active semiconductor layer, plumb with the third electrically insulating layer 7. This allows an RF-SOI region to be obtained.

According to a third embodiment, the fabricating process comprises the same steps as those of the first embodiment or those of the second embodiment. However, contrary to the latter embodiments, in which the local removal of a segment of the intermediate first semiconductor layer 4 and the deposition of the third electrically insulating layer 7 in the cavity 9 are carried out before the transfer of the second semiconductor layer 6 to the intermediate structure, the removing and depositing steps are carried out after the transferring step.

In particular, the removing and depositing steps according to the third embodiment could be carried out on a structure in which a third electrically insulating layer 7 has been formed beforehand, according to the first or second embodiment described above.

The removing and depositing steps of the third electrically insulating layer 7 may be carried out before the digital and radiofrequency components 11, 12 are produced, or indeed after the digital and radiofrequency components are produced, i.e., during the fabrication of the transistor. It may be, in particular, a question of MOS transistor, such as a CMOS transistor.

Figure 7:
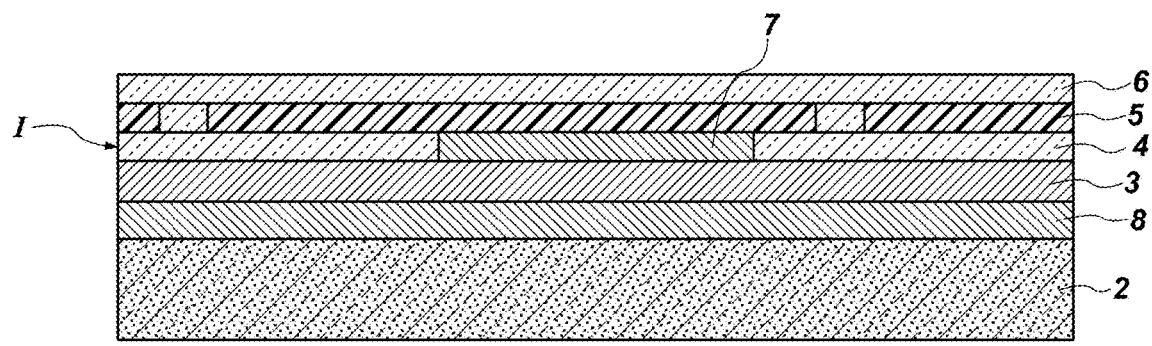
FIG. 7 is a schematic of a multilayer structure.
Figure 8:
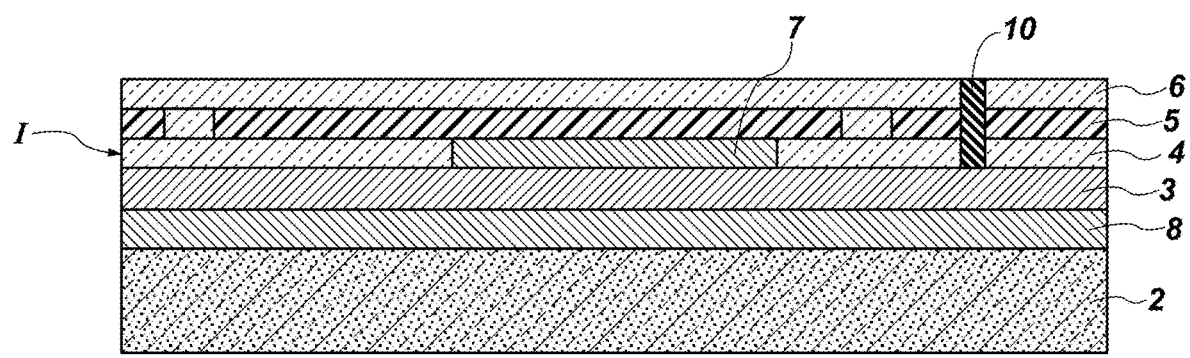
FIG. 8 is a schematic of the multilayer structure of FIG. 7, in which a trench has been produced.

According to this third embodiment, with reference to FIGS. 7 and 8, a trench 10 is dug at a defined distance from the edge of the structure, so that the trench extends from the free surface of the active semiconductor layer 6, through the second electrically insulating layer 5 and the intermediate first semiconductor layer 4, down at least to the first electrically insulating layer 3. This allows the lateral segment delineated by the trench 10 to be physically isolated from the rest of the structure.

Figure 9:
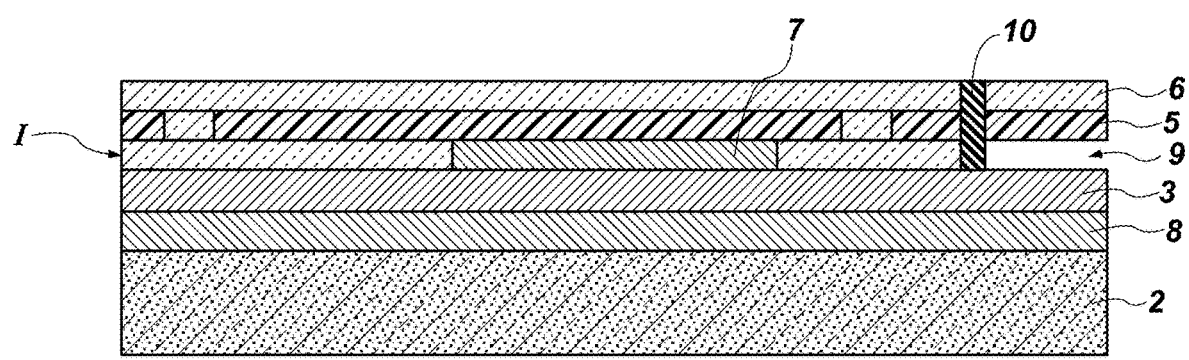
FIG. 9 is a schematic of the multilayer structure of FIG. 8, in which a lateral cavity has been produced.

With reference to FIG. 9, the intermediate first semiconductor layer 4 in the lateral segment is then locally removed in order to form a cavity 9.

As shown in FIG. 9, the cavity 9 is a lateral cavity, located on the edge of the useful zone, and opens onto the exterior of the structure. It is bounded in the thickness of the structure by the first electrically insulating layer 3 and the second electrically insulating layer 5, and laterally by the one or more trenches 10.

Figure 10:
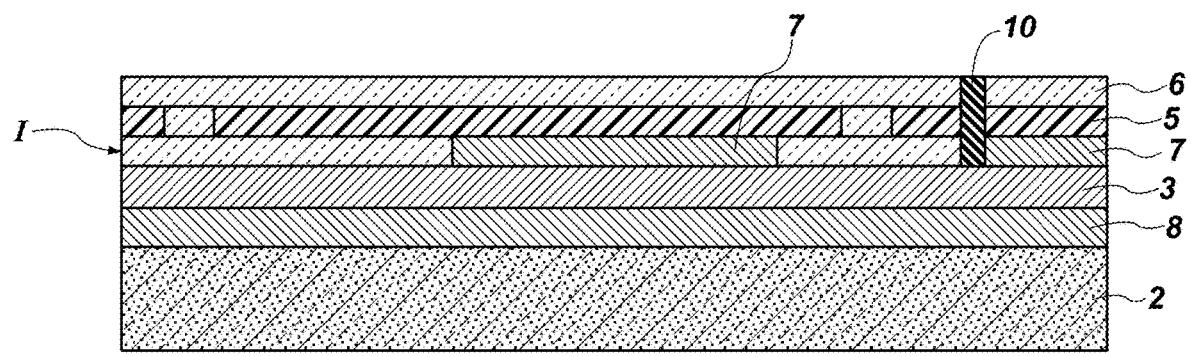
FIG. 10 is a schematic of the multilayer structure of FIG. 9, in which the cavity has been filled with an electrically insulating layer.

With reference to FIG. 10, the third electrically insulating layer 7 is then deposited in the cavity 9, in order to fill the cavity.

One or more radiofrequency components 12 may then be produced on the active semiconductor layer 6, plumb with the third electrically insulating layer 7. An RF-SOI region is then obtained on the structure edge.

The advantage of producing the third electrically insulating layer during the process for fabricating the transistor is that it makes it possible to use the etch masks of this process, and therefore to benefit from an optimal alignment of the various layers of the structure.

The invention claimed is:

1. A semiconductor-on-insulator multilayer structure, comprising in succession from a back side to a front side of the structure:
   a semiconductor carrier substrate having an electrical resistivity between 500 Ω·cm and 30 kΩ·cm,
   a first electrically insulating layer,
   an intermediate layer,
   a second electrically insulating layer, which has a thickness smaller than that of the first electrically insulating layer,
   an active semiconductor layer,
   at least one FD-SOI region, in which the intermediate layer is an intermediate first semiconductor layer, and
   at least one RF-SOI region, adjacent to the at least one FD-SOI region, in which the intermediate layer is a third electrically insulating layer, the at least one RF-SOI region comprising at least one radiofrequency component on the active semiconductor layer and plumb with the third electrically insulating layer.

2. The structure of claim 1, wherein a sum of thicknesses of the first electrically insulating layer, the second electrically insulating layer, and the third electrically insulating layer is between 50 nm and 1500 nm.

3. The structure of claim 1, further comprising a charge-trapping layer between the semiconductor carrier substrate and the first electrically insulating layer.

4. The structure of claim 3, wherein the charge-trapping layer comprises polysilicon or porous silicon.

5. The structure of claim 1, wherein the intermediate first semiconductor layer comprises crystalline or polycrystalline material.

6. The structure of claim 1, wherein the intermediate first semiconductor layer comprises amorphous material.

7. The structure of claim 1, wherein the first electrically insulating layer comprises a layer of silicon oxide.

8. The structure of claim 1, wherein the second electrically insulating layer comprises a layer of silicon oxide.

9. The structure of claim 1, wherein the third electrically insulating layer comprises a layer of silicon oxide.

10. The structure of claim 1, wherein the first electrically insulating layer has a thickness between 20 nm and 1000 nm.

11. The structure of claim 1, wherein the second electrically insulating layer has a thickness between 10 nm and 100 nm.

12. The structure of claim 1, wherein the active semiconductor layer has a thickness between 3 nm and 30 nm.

13. A method of fabricating a semiconductor-on-insulator multilayer structure, comprising the following steps:
   providing a first donor substrate,
   forming a weakened zone in the first donor substrate to delineate an intermediate first semiconductor layer,
   transferring the intermediate first semiconductor layer to a semiconductor carrier substrate, a first electrically insulating layer being at an interface between the first donor substrate and the semiconductor carrier substrate to form an intermediate structure comprising the semiconductor carrier substrate, the first electrically insulating layer and the transferred intermediate first semiconductor layer,
   locally removing one segment of the intermediate first semiconductor layer down to the first electrically insulating layer to form a cavity,
   depositing a third electrically insulating layer in the cavity, providing a second donor substrate, forming a weakened zone in the second donor substrate to delineate an active second semiconductor layer,
   transferring the active second semiconductor layer to the intermediate structure, a second electrically insulating layer being at an interface between the second donor substrate and the intermediate structure, and
   producing:
      at least one digital component in the active second semiconductor layer plumb with the intermediate first semiconductor layer to form an FD-SOI region, and
      at least one radiofrequency component in the active second semiconductor layer, the at least one radiofrequency component plumb with the third electrically insulating layer to form an RF-SOI region.

14. A method of fabricating a semiconductor-on-insulator multilayer structure, comprising the following steps:
   forming an intermediate structure by depositing an intermediate first semiconductor layer on a carrier substrate covered with a first electrically insulating layer,
   locally removing one segment of the intermediate first semiconductor layer down to the first electrically insulating layer to form a cavity,
   depositing a third electrically insulating layer in the cavity, providing a donor substrate,
   forming a weakened zone in the donor substrate to delineate an active second semiconductor layer,
   transferring the active second semiconductor layer to the intermediate structure, a second electrically insulating layer being at an interface between the donor substrate and the intermediate structure, and
   producing:
      at least one digital component in the active second semiconductor layer plumb with the intermediate first semiconductor layer to form an FD-SOI region, and
      at least one radiofrequency component on the active second semiconductor layer, the at least one radiofrequency component plumb with the third electrically insulating layer to form an RF-SOI region.

15. The method of claim 14, wherein the locally removing one segment of the intermediate first semiconductor layer and depositing the third electrically insulating layer in the cavity are carried out after transferring the active second semiconductor layer to the intermediate structure.

16. The method of claim 14, further comprising forming a charge-trapping layer on the carrier substrate, the charge-trapping layer being arranged between the carrier substrate and the first electrically insulating layer.

17. The method of claim 14, wherein the local removal comprises depositing a mask by lithography and etching the intermediate first semiconductor layer through at least one aperture of the mask.

18. The method of claim 14, further comprising, before the transferring the active second semiconductor layer to the intermediate structure, treating free surfaces of the intermediate first semiconductor layer and the third electrically insulating layer to decrease a roughness thereof.

19. The method of claim 13, wherein the locally removing one segment of the intermediate first semiconductor layer and the depositing the third electrically insulating layer in the cavity are carried out after transferring the active second semiconductor layer to the intermediate structure.

20. The method of claim 13, further comprising forming a charge-trapping layer on the semiconductor carrier substrate, the charge-trapping layer being arranged between the semiconductor carrier substrate and the first electrically insulating layer.

\* \* \* \* \*